United States Patent [19]
Back

[11] Patent Number: 5,175,549
[45] Date of Patent: Dec. 29, 1992

[54] PULSE WIDTH MODULATION DECODER

[75] Inventor: Dong-cherl Back, Kyunggi-do, Rep. of Korea

[73] Assignee: Samsung Electronics Co., Ltd., Kyungki-do, Rep. of Korea

[21] Appl. No.: 730,005

[22] Filed: Jul. 15, 1991

[30] Foreign Application Priority Data

Jan. 17, 1991 [KR] Rep. of Korea .......................... 91-735

[51] Int. Cl.⁵ .............................................. H03M 1/82
[52] U.S. Cl. ..................................... 341/152; 341/144
[58] Field of Search ................................ 341/152, 144

[56] References Cited
U.S. PATENT DOCUMENTS 4,233,591 11/1980 Murata et al. ........................ 341/152
4,573,039 2/1986 Suzuki et al. ........................ 341/152

Primary Examiner—Marc Hoff
Attorney, Agent, or Firm—Robert E. Bushnell

[57] ABSTRACT

The present invention relates to a pulse width modulation (PWM) decoder, and more particularly to a PWM decoder which demodulates a pulse width modulated signal for proper interface with the operational characteristics of an object to be controlled. The present invention includes a PWM input terminal for receiving a PWM signal, an integrator for converting the PWM signal to a linear analog signal, and a transfer characteristic converter for changing the slope of the transfer characteristic of the integrator, so that a microcomputer can be interfaced with a signal processor without changing the microcomputer's internal design.

6 Claims, 2 Drawing Sheets

PULSE WIDTH MODULATION DECODER

BACKGROUND OF THE INVENTION

The present invention relates to a pulse width modulation decoder.

Pulse width modulation (hereinafter, referred to as "PWM") is a method of encoding a sequence of numerical values by modulating the duty cycle of a fixed-frequency square-wave carrier signal. More specifically, the duty cycle of each successive period of the carrier signal is modulated in proportion to its corresponding numerical value in the sequence. Typically, the information represented by the sequence of numerical values is either a succession of distinct measurement results or periodic samples of a continuous waveform.

The purpose of a PWM decoder is to recover the originally encoded sequence of numerical values from the modulated signal, typically by successive generation of a proportional analog signal based on the sequence of numerical values. One known PWM decoder includes a resistor-capacitor integrator circuit and a PWM decoder/encoder applied to a digital control apparatus, thereby interfacing with a controlled object. This will be described with reference to the attached drawings.

FIG. 1 is a controlling circuit using a PWM signal. In FIG. 1, a microcomputer 1 is a PWM signal source. An integrator 2 consisting of a diode D1, two resistors R1 and R2, and three capacitors C1, C2 and C3 demodulates a PWM signal, producing a linear analog signal. A signal processor 3 receives the output of the integrator 2 to drive a controlled object (not shown). Here, when driving the controlled object, the signal processor 3 has a slope characteristic different from that of the PWM signal. Therefore, it is necessary for the purpose of providing a compatible slope characteristic between the linear analog signal and the object to be controlled by the signal processor 5 that either the PWM signal from the microcomputer 1 to have an identical slope characteristic of the controlled object, or the demodulation characteristic of the integrator 2 to have a slope characteristic of the controlled object in order to provide proper interface with the signal processor 3 for driving the controlled object effectively.

However, the conventional microcomputer uses complex circuits to generate a proper PWM signal. Also, conventional integrators used in demodulating the PWM signal are linear and the microcomputer can not precisely control an object whose operational characteristics are of a different slope.

SUMMARY OF THE INVENTION

Accordingly, it is an object of the present invention to provide a pulse width modulation decoder which can demodulate a constant-slope PWM signal into an analog signal with a slope suitable for an object to be controlled.

To achieve the object, a pulse width modulation decoder according to the present invention includes:
a PWM input terminal for receiving a pulse width modulated signal;
an integrator for converting the pulse width modulated signal into an analog signal; and
a transfer characteristic converter for adapting the slope characteristic of the output signal of the integrator.

BRIEF DESCRIPTION OF THE DRAWINGS

The above object and other advantages of the present invention will become more apparent by describing the preferred embodiment of the present invention with reference to the attached drawings, in which.

DETAILED DESCRIPTION OF THE INVENTION

Figure 1:
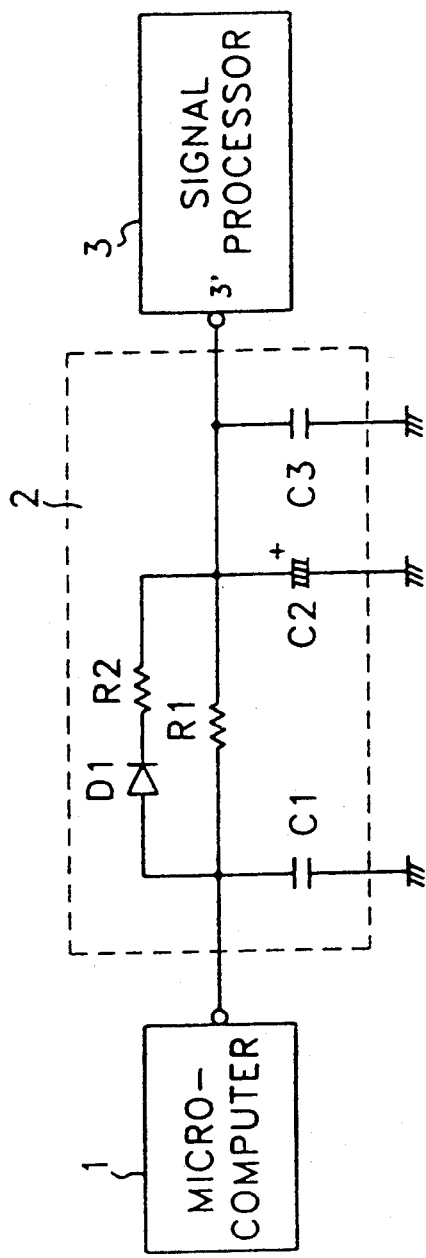
FIG. 1 is a block diagram showing an embodiment of the conventional pulse width modulation decoder.
Figure 2:
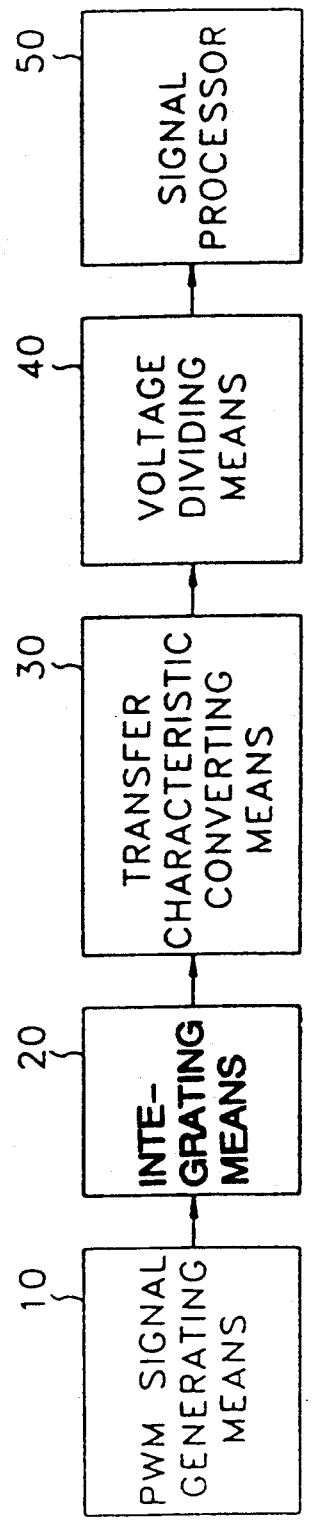
FIG. 2 is a block diagram showing an embodiment of the pulse width modulation decoder according to the present invention.

With reference to FIG. 2, a PWM signal generator 10 produces a pulse width modulated signal to be supplied to an integrator 20. The PWM signal generator 10 could be in the form of a microcomputer.

The integrator 20 demodulates the pulse width modulated signal from the PWM signal generator 10 into a linear analog signal, and supplies the demodulated analog signal to a transfer characteristic converter 30.

The transfer characteristic converter 30 changes the slope of the linear signal present at the output of the integrator 20.

A voltage divider 40 divides the output voltage of the transfer characteristic converter 30 by a fixed ratio, properly interfacing the output signal of the transfer characteristic converter 30 with the input of a signal processor 50.

The signal processor 50 processes the demodulated PWM signal recieved from the voltage divider 40 to drive an object to be controlled (not shown).

Figure 3:
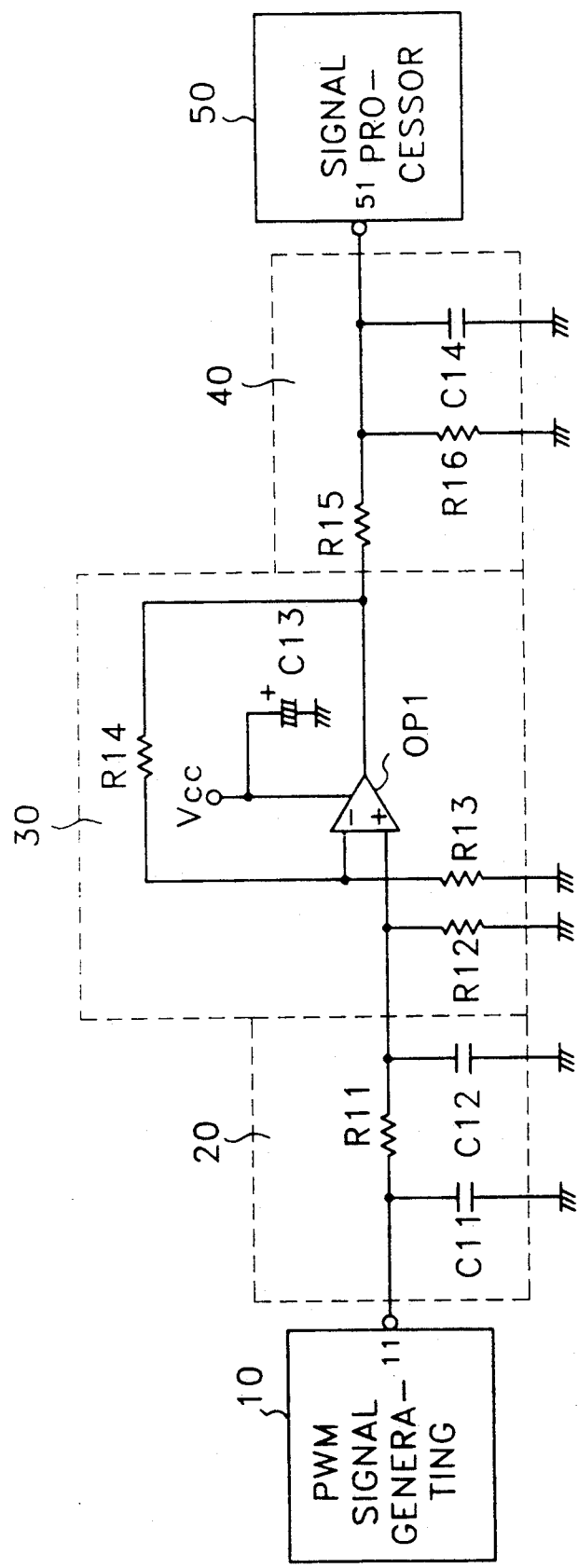
FIG. 3 is a detailed circuit diagram of the pulse width modulation decoder shown in FIG. 2.

FIG. 3 is a detailed circuit diagram of the pulse width modulation decoder shown in FIG. 2.

In FIG. 3, the integrator 20 includes a resistor R11 and a capacitor C12 connected in series between an output terminal 11 of the PWM signal generator 10 and ground and a capacitor C11 connected between output terminal 11 and ground.

The transfer characteristic converter 30 consists of an operational amplifier (hereinafter, referred to as "OP Amp") OP1 whose non-inverted terminal is both connected to a node between resistor R11 and capacitor C12 and grounded through a resistor R12, whose inverted terminal is both grounded through a resistor R13 and connected to its output terminal through a resistor R14, and has a capacitor C13 connected between its power supply input terminal and ground.

The voltage divider 40 includes two resistors R15 and R16 in series connected between the output terminal of the OP Amp OP1 and ground, and a capacitor C14 connected between ground and a node between the two resistors R15 and R16.

The input terminal of the signal processor 50 is connected to a node between the two resistors R15 and R16.

In the operation of the circuit shown in FIG. 3, the PWM signal generator 10 outputs a PWM signal through output terminal 11.

The PWM signal is converted into a linear analog signal by the resistor R11 and the capacitor C12 and supplied to the inverted terminal of OP Amp OP1.

The output gain of OP Amp OP1 is obtained as follows:

$$V_o = \left(1 - \frac{R14}{R13}\right) V_i$$
$$= 2 V_i$$

where

Vi is the input voltage,

Vo is the output voltage, and

R13 is equal to R14.

Thus, in this example, when the ratio of the output signal to the input signal of the OP Amp OP1, i.e., the slope, becomes 2, the output is proportionally changed with respect to the input, and proportionally improves the transfer characteristic by a kind of slope-conversion factor.

The voltage divider 40 divides the output voltage of the OP Amp OP1 by a voltage dividing ratio determined by the resistance values of the resistors R15 and R16, and then supplies the result to input terminal 51 of the signal processor 50.

During operation, the capacitor C13 connected between the power supply input terminal of the OP Amp OP1 and ground, the capacitor C14 connected between the input terminal 51 of the signal processor 50 and ground, and the capacitor C11 connected between the output terminal 11 of the PWM signal generator 10 and ground are bypass capacitors to filter out a noise.

As described above, according to the present invention, a transfer characteristic converter changes the transfer characteristic of a pulse width modulation signal, i.e. the slope, so that a signal processor can be interfaced with the microcomputer without changing the microcomputer's internal design.

What is claimed is:

1. A pulse width modulation decoder, comprising:
a pulse width modulated signal input terminal for receiving a pulse width modulated signal;
integrator means having predetermined transfer characteristics, for converting said pulse width modulated signal into a first analog signal having a first slope in accordance with said predetermined transfer characteristics; and
transfer characteristic converter means directly coupled to said integrator means to receive said first analog signal, for adapting said first slope of said first analog signal into a second analog signal having a second slope compatible for interfacing a signal processor, wherein said second slope has slope characteristics different from said first slope of said analog signal.

2. A pulse width modulation decoder as claimed in claim 1, further comprising a voltage dividing means for dividing the voltage of the output signal of said transfer characteristic converting means to be properly supplied to said signal processor.

3. A pulse width modulation decoder as claimed in claim 1, wherein said transfer characteristic converting means comprises a non-inverting amplifying circuit using an operational amplifier having a bypass capacitor connected between a power supply of said operational amplifier and ground for filtering noise interference.

4. A pulse width modulation decoder, comprising:
means for generating pulse width modulated signals;
integrator means having a first predetermined transfer function coupled to receive said pulse width modulated signals, for integrating said pulse width modulated signals to provide first integrated signals having a first slope in accordance with said first predetermined transfer function; and
amplifier means having a second predetermined transfer function directly coupled to said integrator means to receive said first integrated signals, for converting said first slope of said first integrated signals in accordance with said second predetermined transfer function to provide second integrated signals having a second slope compatible for interfacing a signal processor, wherein said second slope has slope characteristics different from said first slope of said integrated signals.

5. The pulse width modulation decoder as claimed in claim 4, further comprises a voltage divider having a predetermined voltage dividing ratio coupled to receive said second integrated signals for dividing voltages of said second integrated signals in accordance with said predetermined voltage dividing ratio prior to interfacing with said signal processor.

6. The pulse width modulation decoder as claimed in claim 4, wherein said amplifier means is a non-inverting amplifier having a bypass capacitor connected between a power supply and ground for filtering noise interference.

* * * * *